US011955086B2

(12) United States Patent
Gu (10) Patent No.: US 11,955,086 B2
(45) Date of Patent: Apr. 9, 2024

(54) DISPLAY DEVICE AND ELECTRONIC DEVICE INCLUDING THE SAME

(71) Applicant: Samsung Display Co., LTD., Yongin-si (KR)

(72) Inventor: Bon Seog Gu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/881,609

(22) Filed: Aug. 5, 2022

(65) Prior Publication Data

US 2023/0104826 A1 Apr. 6, 2023

(30) Foreign Application Priority Data

Oct. 1, 2021 (KR) .................. 10-2021-0131185

(51) Int. Cl.
| | |
|---|---|
| G09G 3/3266 | (2016.01) |
| G02B 27/01 | (2006.01) |
| G09G 3/3275 | (2016.01) |
| H10K 59/131 | (2023.01) |

(52) U.S. Cl.
CPC ....... *G09G 3/3266* (2013.01); *G02B 27/0172* (2013.01); *G09G 3/3275* (2013.01); *H10K 59/131* (2023.02); *G02B 2027/014* (2013.01); *G02B 2027/0178* (2013.01); *G09G 2320/0233* (2013.01)

(58) Field of Classification Search
CPC ........ H10K 59/60; H10K 59/65; H10K 39/34; G02B 27/0172; G09G 3/3266; G09G 3/3275
See application file for complete search history.

(56) References Cited

U.S. PATENT DOCUMENTS

| 11,211,433 B2 * | 12/2021 | Cancel Olmo ........... G06F 3/01 |
| 2017/0142360 A1 * | 5/2017 | Goto ........................ H04N 5/33 |
| 2018/0308832 A1 * | 10/2018 | Shin ...................... H01L 25/162 |
| 2022/0028359 A1 | 1/2022 | Gu |
| 2022/0102687 A1 * | 3/2022 | Wang ................... G02B 5/3016 |
| 2022/0116519 A1 * | 4/2022 | Nikhara ................. H04N 23/57 |

FOREIGN PATENT DOCUMENTS

KR     10-2022-0014440     2/2022

* cited by examiner

*Primary Examiner* — Sardis F Azongha
(74) *Attorney, Agent, or Firm* — H.C. Park & Associates, PLC (57) ABSTRACT

A display device includes a silicon substrate; a semiconductor layer provided on the silicon substrate and including a pixel circuit; an image sensor provided on the silicon substrate and activated based on an imaging instruction; light emitting elements disposed on the semiconductor layer and electrically connected to the pixel circuit; and a display driver electrically connected to the pixel circuit to control the pixel circuit and to control image luminance of an imaging frame in which the image sensor is activated.

18 Claims, 8 Drawing Sheets

DISPLAY DEVICE AND ELECTRONIC DEVICE INCLUDING THE SAME

CROSS REFERENCE TO RELATED APPLICATION

This application claims priority from and the benefit of Korean Patent Application No. 10-2021-0131185, filed on Oct. 1, 2021, which is hereby incorporated by reference for all purposes as if fully set forth herein.

BACKGROUND

Field

Embodiments of the invention relate generally to a display device and an electronic device including the same.

Discussion of the Background

Recently, as interest in an information display is increasing, research and development for display devices are continuously conducted. Particularly, research is being developed to apply a display panel and a display device to a head mounted electronic device, a glasses-type electronic device, and the like to implement an augmented reality image and a virtual reality image.

The above information disclosed in this Background section is only for understanding of the background of the inventive concepts, and, therefore, it may contain information that does not constitute prior art.

SUMMARY OF THE INVENTION

Example embodiments provide a display device that may control display luminance when imaging an image of a display device in which an image sensor is integrated into display-on silicon and is packaged.

Example embodiments provide an electronic device including the display device.

The object of the present invention is not limited to the above-described objects, and may be variously extended without departing from the spirit and scope of the present invention.

Additional features of the inventive concepts will be set forth in the description which follows, and in part will be apparent from the description, or may be learned by practice of the inventive concepts.

According to example embodiments, a display device may include a silicon substrate; a semiconductor layer provided on the silicon substrate and including a pixel circuit; an image sensor provided on the silicon substrate and activated based on an imaging instruction; light emitting elements disposed on the semiconductor layer and electrically connected to the pixel circuit; and a display driver electrically connected to the pixel circuit to control the pixel circuit and to control image luminance of an imaging frame in which the image sensor is activated.

The display driver may generate black image data corresponding to the imaging frame based on the imaging instruction and provide a data signal corresponding to the black image data to the pixel circuit.

The light emitting elements may display a black image in the imaging frame.

The display driver may correct image data of first and second frames adjacent to before and after the imaging frame to increase luminance of the first frame and luminance of the second frame.

When input image data of the first frame and input image data of a third frame not adjacent to the imaging frame are the same, the luminance of the first frame may be higher than that of the third frame.

The display driver may include a controller generating black image data corresponding to the imaging frame based on the imaging instruction; and a data driver that converts the black image data into an analog data signal and supplies the data signal to the light emitting elements.

The display driver may further include a memory temporarily storing input image data; an image analyzer counting black image data of the input image data in units of frames based on the imaging instruction; and an imaging frame determiner that determines the imaging frame based on a counting value of the black image data and generates an image sensor activation signal.

The imaging frame determiner may compare the counting value with a predetermined threshold value and determine a frame in which the counting value is larger than the threshold value as the imaging frame.

The image sensor may image an external image in the imaging frame in response to the image sensor activation signal.

The silicon substrate may include a single crystal silicon wafer, a polycrystalline silicon wafer, or an amorphous silicon wafer.

The pixel circuit may include a CMOS circuit.

Each of the light emitting elements may include an inorganic light emitting element, and the semiconductor layer may further include a contact protrude from the pixel circuit in a vertical direction to electrically connect the inorganic light emitting element and the pixel circuit.

Each of the light emitting elements may include an organic light emitting element.

The image sensor may include a CMOS image sensor, and the image sensor may be mounted on the semiconductor layer in a form of a module.

The image sensor may include a CMOS image sensor, and the image sensor may be integrated into the semiconductor layer.

According to example embodiments, an electronic device may include a silicon substrate; a semiconductor layer provided on the silicon substrate and including a pixel circuit; an image sensor provided on the semiconductor layer and imaging an image; light emitting elements disposed on the semiconductor layer and electrically connected to the pixel circuit; a display driver electrically connected to the pixel circuit to control the pixel circuit and to control image luminance of an imaging frame in which the image sensor is activated; a sensor driver controlling the image sensor based on an imaging instruction; and a processor providing the imaging instruction to the display driver and the sensor driver.

The display driver may generate black image data corresponding to the imaging frame based on the imaging instruction and provide a data signal corresponding to the black image data to the pixel circuit; and the light emitting elements may display a black image in the imaging frame.

The display driver may correct image data of first and second frames adjacent to before and after the imaging frame to increase luminance of the first frame and luminance of the second frame.

At least one of the image sensor and the processor may be mounted on the semiconductor layer.

The processor may generate input image data corresponding to an augmented reality image in which an image obtained from the image sensor and a display image are combined, and may provide the input image data to the display driver.

The display device and the electronic device including the same according to the embodiments of the present invention may have a configuration in which an image sensor is integrated into display-on silicon and is packaged. Accordingly, a connector or cable such as an FPCB connected to a camera module including the image sensor may be removed, and it is possible to easily implement an ultra-small display device applied to smart glasses that realizes an augmented reality image.

In addition, by lowering display luminance when imaging an image in the configuration in which the image sensor is integrated into the display-on silicon, flare and ghosting of the imaged image due to luminance of a display image are eliminated or minimized, and quality of the imaged image may be improved.

However, the effects of the present invention are not limited to the above-described effects, and may be variously extended without departing from the spirit and scope of the present invention.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and a Z-axis are not limited to three axes of a rectangular coordinate system, such as the x, y, and z-axes, and may be interpreted in a broader sense. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an embodiment of the present invention will be described in detail with reference to the accompanying drawings. The same reference numerals are used for the same constituent elements on the drawings, and duplicate descriptions for the same constituent elements are omitted.

Figure 1A:
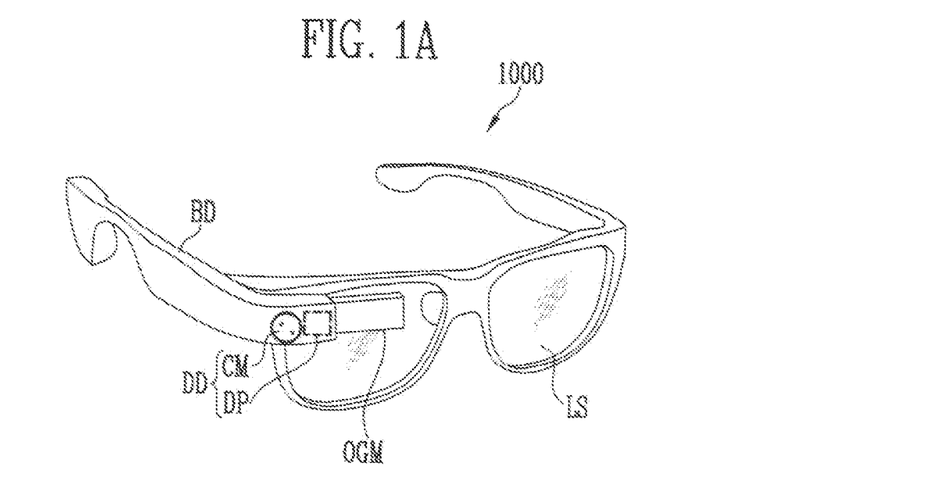
FIG. 1A illustrates an example of an electronic device including a display device according to embodiments of the present invention.
Figure 1B:
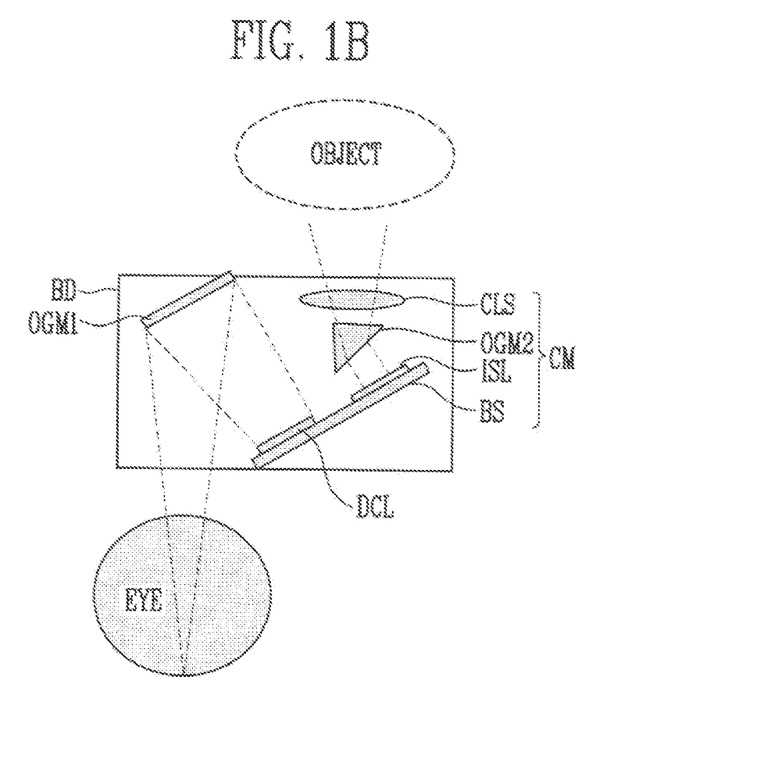
FIG. 1B illustrates an example of an inner configuration of a body of the electronic device of FIG. 1A.

FIG. 1A illustrates an example of an electronic device including a display device according to embodiments of the present invention, and FIG. 1B illustrates an example of an inner configuration of a body of the electronic device of FIG. 1A.

Referring to FIG. 1A and FIG. 1B, a display device DD may be applied to an electronic device 1000 such as a wearable electronic device.

In the embodiment, the wearable electronic device may include smart glasses, a head mounted device, and the like. FIG. 1A illustrates smart glasses as an example of a wearable electronic device.

The smart glasses may include a body BD and a lens LS. The smart glasses are a wearable electronic device that can be worn on a user's face, and may have a structure in which a portion of the body BD is folded or unfolded. For example, the smart glasses may display an augmented reality (AR) image.

The body BD may include a housing configured to support the lens LS and arm parts for the user to wear. The arm parts may be coupled to the housing by hinges to be folded or unfolded.

The body BD may include a display panel DP, a camera module CM, a battery, a touch pad, a microphone, and/or a physical button. These components may be mounted on the body BD or may be embedded in the body BD. In the embodiment, the display panel DP embedded into the body BD may be manufactured to be ultra-small. For example, a display area of the display panel DP may have a size of about 2 inches or less. Alternatively, the display area and the camera module CM may have similar flat areas.

In addition, a processor configured to control the display panel DP, the camera module CM, and the like may be embedded in the body BD.

In the embodiment, the smart glasses may further include a light guide member OGM. An image outputted from the display panel DP may be provided to the light guide member OGM. The light guide member OGM reflects and/or disperses light of the image to realize an effect such that a user views an image of 20 inches or larger. For example, the light guide member OGM may be provided as a prism.

However, this is an example and embodiments are not limited thereto. The display panel DP may be embedded in the lens LS in a form of a transparent display.

The lens LS may be an optical member that transmits light or reflects light. The lens LS may include glass and/or a transparent synthetic resin.

In the embodiment, as illustrated in FIG. 1B, a display element layer DCL of the display panel DP and an image sensor ISL of the camera module CM may be disposed on a base substrate BS.

The base substrate BS may include a silicon substrate and a semiconductor pattern formed on the silicon substrate. Accordingly, a backplane circuit (for example, pixel circuit, etc.) of the display panel DP of the base substrate BS may be formed.

The display element layer DCL is disposed on the base substrate BS, and may be electrically connected to the pixel circuit of the base substrate BS. The display element layer DCL may include a light emitting element array including an LED light emitting element having a micro size or less. However, this is only an example, and the display element layer DCL may include a light emitting element array including an organic light emitting element such as an OLED.

Light outputted from the display element layer DCL may be reflected from a first light guide member OGM1 to be provided to a user's eye.

In the embodiment, the image sensor ISL may be mounted on the base substrate BS. The image sensor ISL may include a photo diode, switch elements controlling the photo diode, and wires.

In the embodiment, the camera module CM may include a camera lens CLS, a second light guide member OGM2, and an image sensor ISL in a module form. Light reflected from an object may pass through the second light guide member OGM2 through the camera lens CLS to be provided to the image sensor ISL. The image sensor ISL may be activated based on one or more imaging instructions, and may image an object.

Figure 2:
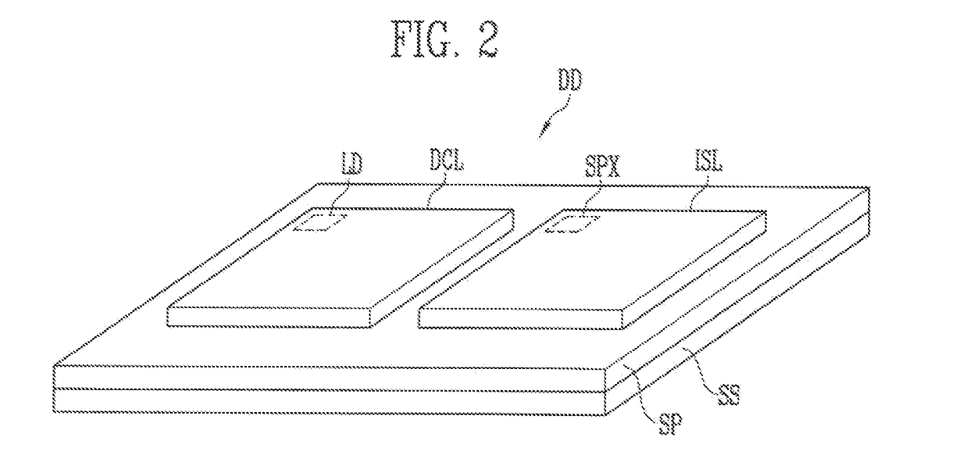
FIG. 2 illustrates a display device according to embodiments of the present invention.
Figure 3:
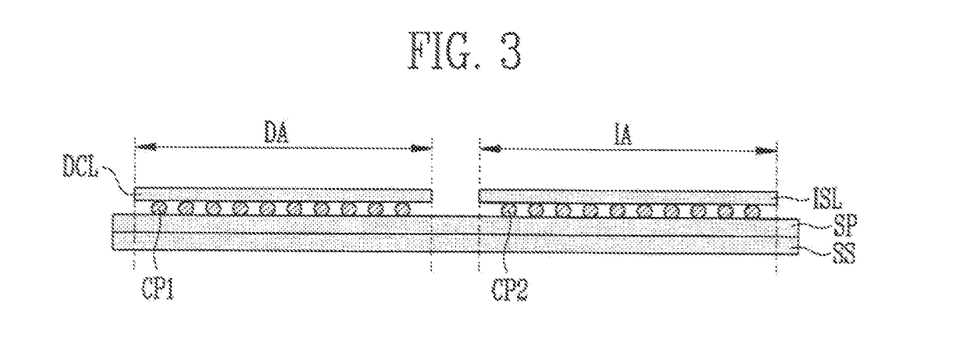
FIG. 3 illustrates a schematic cross-sectional view of an example of the display device of FIG. 2.

FIG. 2 illustrates a display device according to embodiments of the present invention, and FIG. 3 illustrates a schematic cross-sectional view of an example of the display device of FIG. 2.

Referring to FIG. 2 and FIG. 3, the display device DD may include a silicon substrate SS, a semiconductor layer SP, a light emitting element layer DCL including a light emitting element LD, and an image sensor ISL including a sensor pixel SPX.

The silicon substrate SS may include a single crystal silicon wafer, a polycrystalline silicon wafer, or an amorphous silicon wafer. The semiconductor layer SP may be formed on the silicon substrate SS through a semiconductor process. For example, the silicon substrate SS on which the semiconductor layer SP is formed may correspond to the base substrate BS of FIG. 1B as a silicon semiconductor substrate.

As illustrated, the semiconductor layer SP may be formed on the silicon substrate SS through a complementary metal oxide semiconductor (CMOS) process. The semiconductor layer SP may include a CMOS type of pixel circuit. For example, the pixel circuit may include a CMOS circuit including a P-type transistor and an N-type transistor.

In addition, the semiconductor layer SP may include a driving circuit configured to drive the pixel circuit. For example, the semiconductor layer SP may further include a scan driving circuit having a CMOS structure configured to drive a scan line.

The light emitting element layer DCL including the light emitting element LD may be provided on the semiconductor layer SP. The light emitting element LD may be electrically connected to the pixel circuit of the semiconductor layer SP. Accordingly, the display device DD may be a display-on silicon (DOS) or light emitting diode on silicon (LEDoS) having a light emitting structure on the silicon semiconductor substrate.

In the embodiment, the semiconductor layer SP may further include a sensor-related circuit portion configured to transmit and receive various signals to and from the image sensor ISL.

The image sensor ISL may be provided on the semiconductor layer SP. The image sensor ISL may be electrically connected to the sensor-related circuit portion of the semiconductor layer SP. In the embodiment, the image sensor ISL may include a CMOS image sensor. In the embodiment, the image sensor ISL may be provided in a form of a module, and may be mounted on the semiconductor layer SP.

An overlapping portion of the light emitting element layer DCL may be defined as a display area DA, and an overlapping portion of the image sensor ISL may be defined as an imaging area IA.

In the embodiment, as illustrated in FIG. 3, the semiconductor layer SP may include a first contact CP1 that electrically connects the light emitting element layer DCL and the pixel circuit, and a second contact CP2 that electrically connects the sensor-related circuit part and the image sensor ISL. For example, the first contact CP1 and the second contact CP2 may be bumps formed by protrusions protruding from the semiconductor layer SP.

Accordingly, the semiconductor layer SP is formed on the silicon substrate SS by the display panel (for example, the light emitting element layer DCL) and the image sensor ISL being mounted by the first and second contacts CP1 and CP2, so that the display panel and the camera module may be provided as one package. Accordingly, a connector or cable such as an FPCB configured to connect the image sensor ISL and the camera module including the same to the display panel (display device DD) may be removed. Accordingly, it is possible to easily implement an ultra-small display device DD such as smart glasses that realizes an augmented reality image.

In the embodiment, a display driving chip configured to drive the pixel circuit and the light emitting element LD and a sensor driving chip configured to drive the image sensor ISL may be further mounted on the semiconductor layer SP. In addition, a processor chip configured to drive the display device DD may be mounted on the semiconductor layer SP.

In some embodiments, because the display panel including the light emitting element layer DCL and the camera module including the image sensor ISL may be provided as a single package, the light outputted from the display panel may affect the imaging of the image sensor ISL. For example, when the light from the display panel is incident on the image sensor ISL through a camera lens (for example, the CLS of FIG. 1A) or is directly incident thereon, a number of defects in the imaged image, such as a flare phenomenon and a ghost phenomenon, may be viewed in the imaged image.

Figure 4:
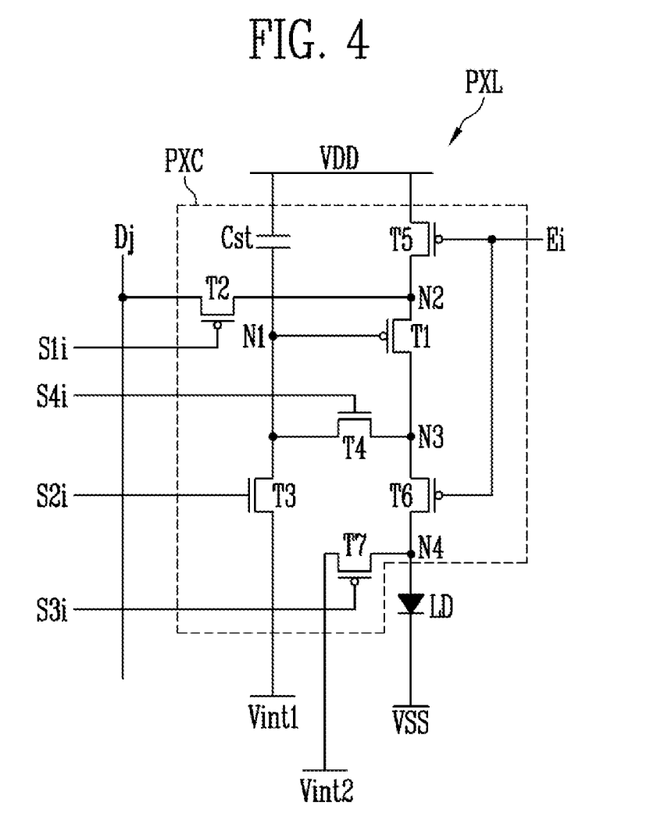
FIG. 4 illustrates a circuit diagram of an example of a pixel included in the display device of FIG. 2.

FIG. 4 illustrates a circuit diagram of an example of a pixel included in the display device of FIG. 2.

In FIG. 4, for better comprehension and ease of description, a pixel PXL disposed at an i-th horizontal line (or an i-th pixel row) and connected to a j-th data line Dj is illustrated (wherein, i and j are natural numbers).

Referring to FIG. 2 and FIG. 4, the pixel PXL may include a light emitting element LD and a pixel circuit PXC.

In the embodiment, the pixel circuit PXC may include first to seventh transistors T1 to T7 and a storage capacitor Cst. The pixel circuit PXC may be formed on the silicon substrate SS through a CMOS process.

The first transistor T1 (or driving transistor) may be connected between a first power line to which a first power source voltage VDD is applied and a first electrode of the light emitting element LD. The first pixel transistor T1 may include a gate electrode connected to a first node N1.

The first transistor T1 may control an amount of current (driving current) flowing from the first power line to a second power line to which a second power voltage VSS is provided via the light emitting element LD based on a voltage of the first node N1. To this end, the first power voltage VDD may be set to be higher than the second power voltage VSS.

The second transistor T2 may be connected between the j-th data line Dj (hereinafter referred to as a data line) and a second node N2. A gate electrode of the second transistor T2 may be connected to an i-th first scan line S1i. The second transistor T2 may be turned on when a first scan signal is supplied to the i-th first scan line S1i to electrically connect the data line Dj and the second node N2.

The third transistor T3 may be connected between the first node N1 and a third power line that transmits a third power source voltage Vint1 (for example, first initialization power source voltage). A gate electrode of the third transistor T3 may be connected to an i-th second scan line S2i. The third transistor T3 may be turned on by a second scan signal supplied to the i-th second scan line S2i. When the third transistor T3 is turned on, the third power source voltage Vint1 may be supplied to the first node N1 (that is, the gate electrode of the first transistor T1).

The fourth transistor T4 may be connected between the first node N1 and a third node N3. A gate electrode of the fourth transistor T4 may be connected to an i-th fourth scan line S4i. When the fourth transistor T4 is turned on, the first transistor T1 may have a diode-connected structure.

The fifth transistor T5 may be connected between the first power line and the second node N2. A gate electrode of the fifth transistor T5 may be connected to an i-th light emitting control line Ei. The sixth transistor T6 may be connected between the third node N3 and the light emitting element LD (or a fourth node N4). A gate electrode of the sixth transistor T6 may be connected to the i-th light emitting control line Ei. The fifth transistor T5 and the sixth transistor T6 may be turned off when a light emitting control signal is supplied to the i-th light emitting control line Ei, and may be turned on in other cases.

The seventh transistor T7 may be connected between a first electrode (that is, the fourth node N4) of the light emitting element LD and a fourth power line that supplies a fourth power source voltage Vint2 (for example, a second initialization power source voltage). A gate electrode of the seventh transistor T7 may be connected to an i-th third scan line S3i. The seventh transistor T7 may be turned on by a third scan signal supplied to the i-th third scan line S3i to supply the fourth power source voltage Vint2 to the first electrode of the light emitting element LD. In the embodiment, the fourth power source voltage Vint2 may be different from the third power source voltage Vint3.

The storage capacitor Cst may be connected between the first power line and the first node N1.

In the embodiment, the first scan signal and the second scan signal may be supplied at different timings. In other words, after the second scan signal is supplied, the first scan signal may be supplied. For example, the second scan signal and the first scan signal may be supplied with a difference of one horizontal period.

In the embodiment, the third scan signal may be supplied after the first scan signal is supplied. For example, a supply interval between the third scan signal and the first scan signal may be one horizontal period. However, this is an example, and the third scan signal may be simultaneously supplied with the second scan signal. Alternatively, the third scan signal may be simultaneously supplied with the first scan signal.

In the embodiment, the pixel circuit PXC may include a P-type transistor and an N-type transistor by a CMOS process. For example, the third and fourth transistors T3 and T4 may be N-type transistors, and the others may be P-type transistors.

However, the configuration of the pixel circuit PXC of FIG. 4 is exemplary, but is not limited thereto. The pixel circuit PXC may have various known circuit structures.

Figure 5:
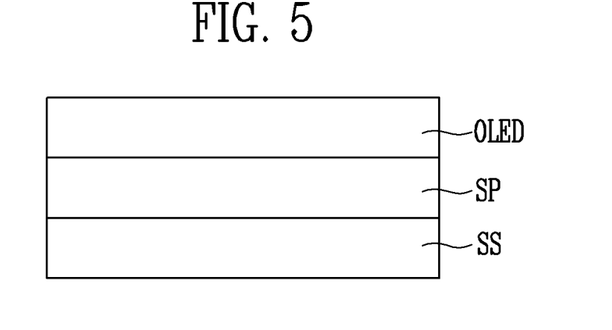
FIG. 5 illustrates a cross-sectional view of an example of a display area of the display device of FIG. 2.

FIG. 5 illustrates a cross-sectional view of an example of a display area of the display device of FIG. 2.

Referring to FIG. 2 and FIG. 5, the display area DA of the display device DD may include the silicon substrate SS, the semiconductor layer SP, and an organic light emitting element OLED as the light emitting element LD.

In the embodiment, the organic light emitting element OLED may be directly formed on the semiconductor layer SP through an organic light emitting element (OLED) deposition process. The organic light emitting element may have a structure in which a first electrode, an organic light emitting layer, and a second electrode are sequentially stacked. The organic light emitting layer may further include a hole injection layer, a hole transport layer, an electron injection layer, an electron transport layer, and the like.

In addition, a functional layer such as a polarization layer, an anti-reflection layer, and a color filter may be further provided on the organic light emitting element OLED.

Figure 6:
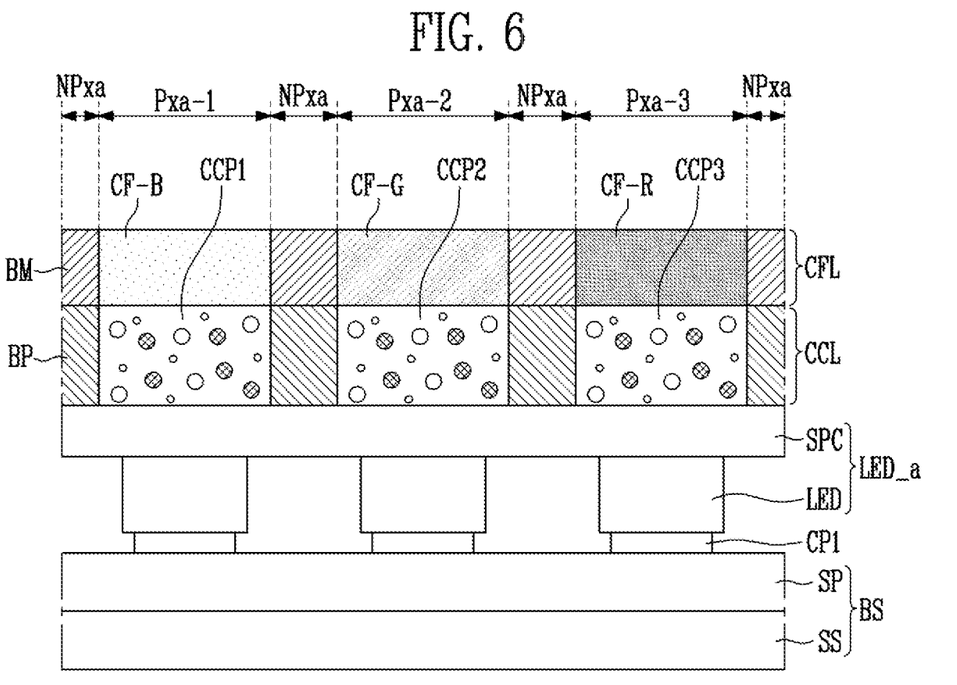
FIG. 6 illustrates a cross-sectional view of an example of a display area of the display device of FIG. 2.

FIG. 6 illustrates a cross-sectional view of an example of a display area of the display device of FIG. 2.

Referring to FIG. 2 and FIG. 6, the display area DA of the display device DD may include the silicon substrate SS, the semiconductor layer SP, and an inorganic light emitting element LED as the light emitting element LD.

A light control layer CCL and a color filter layer CFL may be further disposed on a light emitting element array LED-a including the inorganic light emitting element LED.

In the embodiment, the silicon substrate SS and the semiconductor layer SP may be defined as the base substrate BS. A first contact CP1 may be disposed on the semiconductor layer SP of the base substrate BS. The first contact CP1 may be an element that electrically connect the inorganic light emitting element LED and the semiconductor layer SP. The first contact CP1 may include a reflective material. The first contact CP1 may have a single-layered structure or a multi-layered structure.

In the embodiment, the first contact CP1 may include molybdenum, silver, titanium, copper, aluminum, gold, or an alloy thereof. However, the present invention is not limited thereto, and the first contact CP1 may have a structure in which an indium tin oxide (ITO), silver (Ag), and an indium tin oxide (ITO) are sequentially stacked. For example, a substrate contact (S-C) may include at least one of an indium zinc oxide (IZO), an indium tin oxide (ITO), an indium gallium oxide (IGO), an indium zinc gallium oxide (IGZO), and a mixture/compound thereof.

The light emitting element array LED-a may include a transparent substrate SPS and the inorganic light emitting element LED disposed on the transparent substrate SPS. The transparent substrate SPS may include a material having a light-transmitting property, for example, one of sapphire, GaN, ZnO, and AlO. The transparent substrate SPS is a substrate suitable configured to mount the inorganic light emitting element LED on a layer, and may be formed as a carrier wafer. The transparent substrate SPS may be a conductive substrate or an insulating substrate. In the embodiment, the transparent substrate SPS may be omitted.

The inorganic light emitting element LED is disposed to overlap pixel areas Pxa-1, Pxa-2, and Pxa-3. In the embodiment, the inorganic light emitting element LED generates first light. The first light may be, for example, blue light. However, this is an example, and the color of the light generated by the inorganic light emitting elements LED is not limited thereto.

The light control layer CCL may be disposed on the inorganic light emitting element LED to convert the first light emitted from the inorganic light emitting element LED into the second light. For example, the second light may be white light. Alternatively, the second light may be generated in different colors for respective the pixel areas Pxa-1, Pxa-2, and Pxa-3.

The light control layer CCL may include a first light control portion CCP1 overlapping the first pixel area Pxa-1, a second light control portion CCP2 overlapping the second pixel area Pxa-2, and a third light control portion CCP3 overlapping the third pixel area Pxa-3.

A light emitting body may be included in the first light control portion CCP1, the second light control portion CCP2, and the third light control portion CCP3. The light emitting body may be a particle that converts a wavelength of light. In the embodiment, the light emitting body included in the first light control portion CCP1, the second light control portion CCP2, and the third light control portion CCP3 may be a quantum dot.

Quantum dots are materials with a crystal structure of several nanometers in size, composed of hundreds to thousands of atoms, and have a quantum confinement effect in which an energy band gap thereof increases due to their small size. When light of a wavelength higher than the energy of the band gap is incident on the quantum dots, the quantum dots absorb the light and become an excited state, and fall to a ground state while emitting light of a specific wavelength. The emitted wavelength of light has a value corresponding to the band gap. By controlling the size and composition of the quantum dots, the light emitting characteristic due to the quantum confinement effect may be controlled.

A shape of the quantum dot is not particularly limited to a shape generally used in the art, and may be a spherical, pyramidal, multi-arm, or cubic nanoparticle, nanotube, nano-wire, nano-fiber, nano-plate particle shape, and the like.

The quantum dot may control a color of emitted light according to a particle size thereof, and thus the quantum dot may have various light emitting colors such as blue, red, and green colors. As the particle size of the quantum dots is smaller, light in a shorter wavelength region may be emitted. For example, the particle size of the quantum dots emitting green light may be smaller than the particle size of the quantum dots emitting red light. In addition, the particle size of the quantum dots emitting blue light may be smaller than the particle size of the quantum dots emitting green light.

In the embodiment, the light control layer CCL may include a base resin and a light emitting body. The light control layer CCL may further include scattering particles. The light emitting body and the scattering particles may be included in each light control portion included in the light control layer CCL. However, the present invention is not limited thereto, and the light emitting body and the scattering particles may be included only in a portion of the light control layer CCL.

The light control layer CCL includes partition walls BP disposed between a first light control portion CCP1 and a second light control portion CCP2 that are spaced apart from each other and between the second light control portion CCP2 and a third light control portion CCP3 that are spaced apart from each other. The partition wall BP may overlap a peripheral area NPxa in a plan view. The partition wall BP may prevent light leakage and may separate boundaries between the adjacent light control portions CCP1, CCP2, and CCP3. The partition wall BP may include an organic material. The partition wall BP may include an organic light blocking material including a black pigment or dye. The partition wall BP may include an organic material having hydrophobic properties.

The color filter layer CFL is disposed on the light control layer CCL, and may include first to third color filters CF-B, CF-G, and CF-R and a light blocking pattern BM.

In the embodiment, the first to third color filters CF-B, CF-G, and CF-R may be disposed to be spaced apart from each other in a plan view. However, this is an example, and color filters adjacent to each other may contact or overlap each other.

The first color filter CF-B is disposed to correspond to the first light control portion CCP1, and may transmit blue light. The second color filter CF-G is disposed to correspond to the second light control portion CCP2, and may transmit green light. The third color filter CF-R is disposed to correspond to the third light control portion CCP3, and may transmit red light. Through this, as the second light provided from the light control layer CCL transmits through the color filter layer CFL, blue light may be transmitted in the first pixel area Pxa-1, green light may be transmitted in the second pixel area Pxa-2, and red light may be transmitted in the third pixel area Pxa-3.

In the embodiment, the light blocking pattern BM is provided corresponding to the peripheral area NPxa. The light blocking pattern BM may be formed by including an organic light blocking material or an inorganic light blocking material including a black pigment or dye. In FIG. 6, a thickness of the light blocking pattern BM is exemplarily illustrated as being the same as a thickness of the entire color filter layer CFL, but the present invention is not limited thereto, and the thickness of the light blocking pattern BM may be smaller than the thickness of the entire color filter layer CFL. In addition, at least a portion of the light blocking pattern BM may be omitted.

Figure 7:
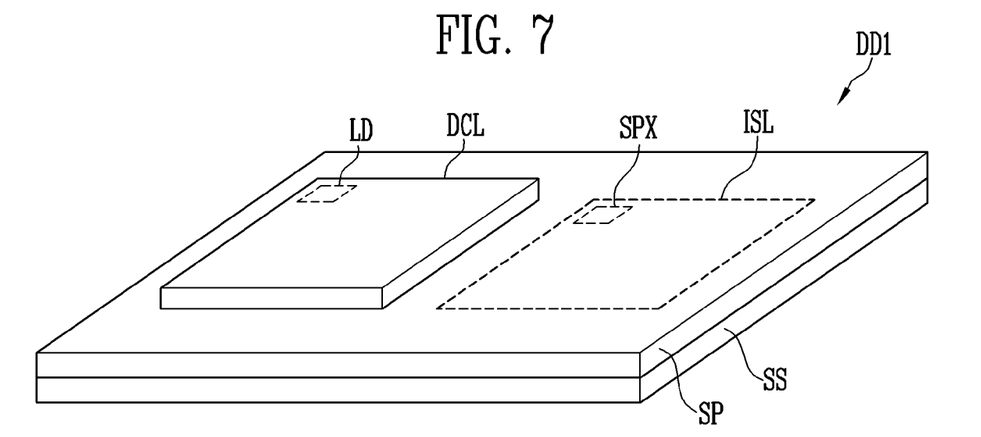
FIG. 7 illustrates a display device according to embodiments of the present invention.

FIG. 7 illustrates a display device according to embodiments of the present invention.

Because a display device DD1 according to the present embodiment is the same as the display device DD described with reference to FIG. 2, except for the configuration of the image sensor ISL, the same reference numerals are used for the same or corresponding components, and duplicate descriptions thereof will be omitted.

Referring to FIG. 7, the display device DD1 may include a silicon substrate SS, a semiconductor layer SP, a light emitting element layer DCL including a light emitting element LD, and an image sensor ISL including a sensor pixel SPX.

In the embodiment, the image sensor ISL may include a CMOS image sensor. The image sensor ISL may be integrated within the semiconductor layer SP. For example, a photo diode, switch elements, and various wires configuring the sensor pixel SPX may be formed during a semiconductor layer SP manufacturing process. A camera lens and the like may be provided on the image sensor ISL integrated in the semiconductor layer SP.

As such, because the image sensor ISL is integrated in the semiconductor layer SP, down-size of the display device DD1 may be more easily achieved.

Figure 8:
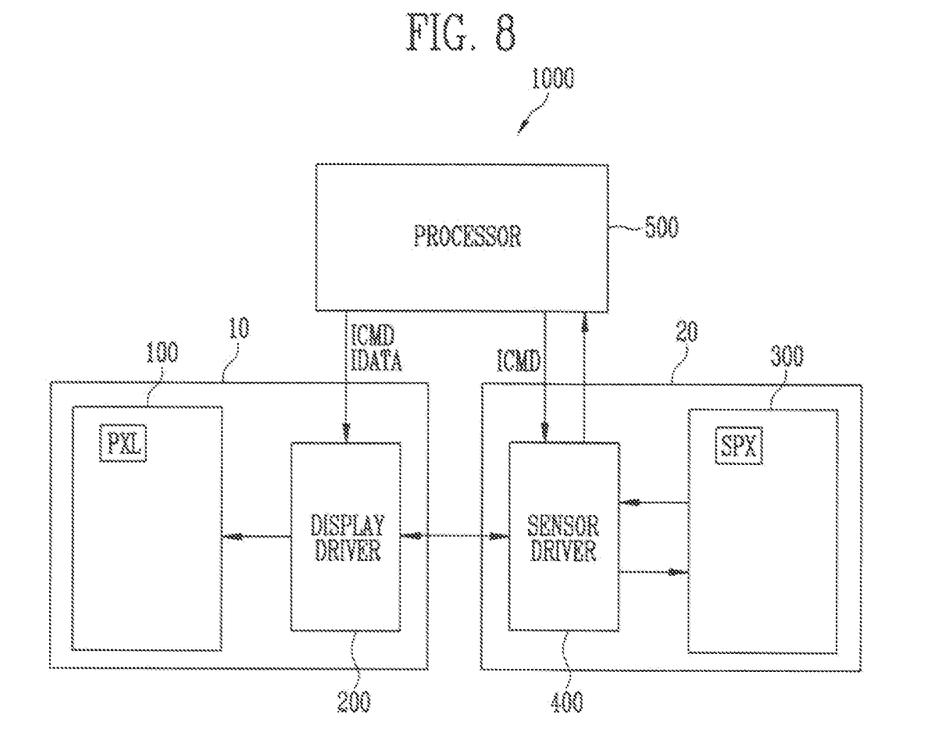
FIG. 8 illustrates a block diagram of an electronic device according to embodiments of the present invention.

FIG. 8 illustrates a block diagram of an electronic device according to embodiments of the present invention.

Referring to FIG. 2 and FIG. 8, an electronic device 1000 may include a display 10, a camera 20, and a processor 500.

The display 10 may include a display panel 100 and a display driver 200. The camera 20 may include an image sensor 300 and a sensor driver 400.

In the embodiment, the display panel 100 may include the silicon substrate SS, the semiconductor layer SP provided on the silicon substrate SS, and the light emitting element layer DCL, which are described with reference to FIG. 2. The light emitting element LD of the light emitting element layer DCL and the pixel circuit of the semiconductor layer SP may configure the pixel PXL. The display panel 100 includes a pixel array including the pixels PXL, and an image may be displayed through the pixel array.

The display driver 200 may be electrically connected to the pixel circuit to control the pixel circuit. That is, the light emitting element LD may emit light by signals provided from the display driver 200. The display driver 200 may include components such as a scan driver, a data driver, and a timing controller.

In the embodiment, the display driver 200 may control image luminance of an imaged frame imaged by the image sensor 300. For example, the display driver 200 may control an image based on input image data IDATA and an imaging instruction ICMD provided from the processor 500. The display driver 200 may generate black image data corresponding to an imaging frame based on the imaging instruction ICMD, and may provide a data signal corresponding to the black image data to the pixel circuit of the display 100. The display 100 may display the black image in the imaging frame.

Meanwhile, at least a portion of the display driver 200 may be integrated in the semiconductor layer SP by a CMOS process. A detailed configuration and operation of the display driver 200 will be described in detail below with reference to FIG. 9.

The image sensor 300 may be implemented as a CMOS image sensor. The image sensor 300 may include a sensor pixel array including the sensor pixels SPX. In the embodiment, the image sensor 300 may be mounted on the semiconductor layer SP. In another embodiment, the image sensor 300 may be integrated in the semiconductor layer SP.

The sensor driver 400 may control the image sensor 300 based on the imaging instruction ICMD provided from the processor 500. The sensor driver 400 may include a row driver, a column driver, and a readout driver configured to drive the image sensor. A signal sensed by the image sensor 300 may be provided to the processor 500 through the sensor driver 400 (for example, the readout driver).

In the embodiment, at least a portion of the sensor driver 400 may be integrated in the semiconductor layer SP by a CMOS process.

The processor 500 may control the display driver 200 and the sensor driver 400, and may supply various data. In the embodiment, the processor 500 may include a display controller that controls the display driver 200, a camera controller that controls the sensor driver 400, and an image processor that processes the image data.

The processor 500 may supply an imaging instruction ICMD to the display driver 200 and the sensor driver 400 in response to a touch input or a voice input from the user.

The processor 500 may provide the input image data IDATA in digital format to the display driver 200. In the embodiment, the processor 500 may generate input image data IDATA corresponding to an augmented reality image by combining data corresponding to the imaged image and data corresponding to other information to be displayed.

In the embodiment, the processor 500 may be provided in a form of a driving chip, and may be mounted on the semiconductor layer SP. Accordingly, configurations of a cable (connector) configured to connect the processor 500 and the display 10 and/or a cable (connector) configured to connect the processor 500 and the camera 20 may be omitted.

In the embodiment, the display driver 200 and the sensor driver 400 may directly transmit and receive data (or signals) through a predetermined interface.

Figure 9:
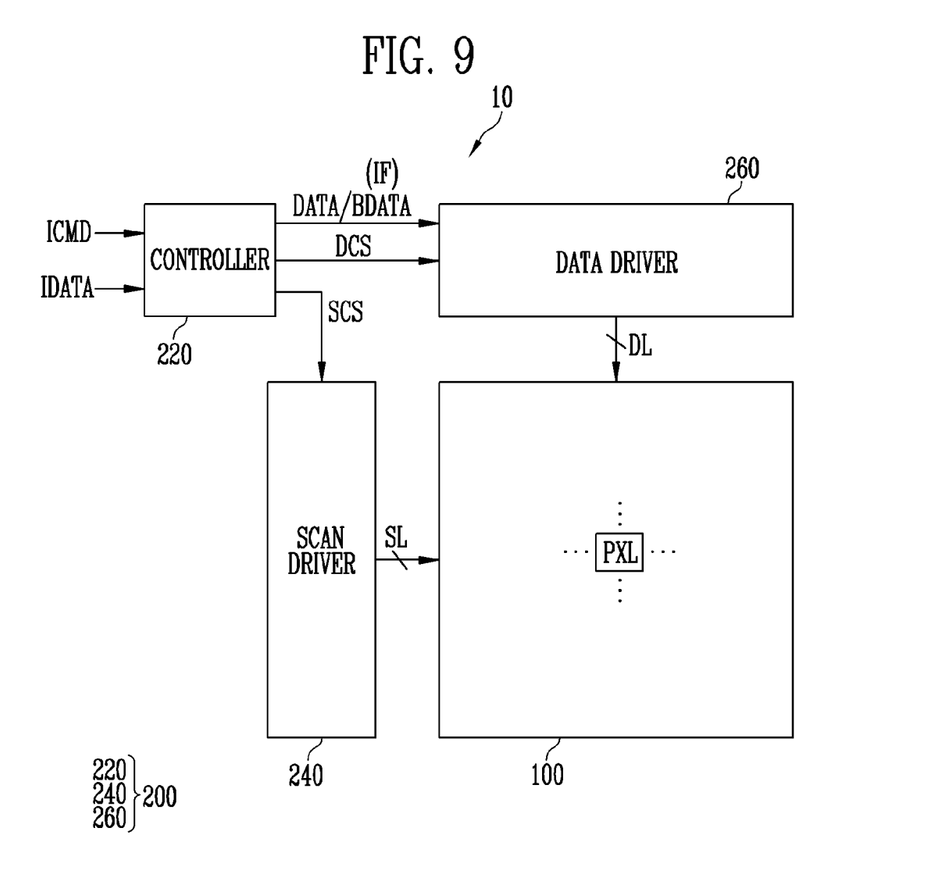
FIG. 9 illustrates a block diagram of an example of a display device included in the electronic device of FIG. 8.

FIG. 9 illustrates a block diagram of an example of a display device included in the electronic device of FIG. 8.

Referring to FIG. 8 and FIG. 9, the display driver 200 may include a controller 220, a scan driver 240, and a data driver 260.

At least some functions of the controller 220, the scan driver 240, and data driver 260 may be integrated into one IC. In addition, at least some functions of the controller 220, the scan driver 240, and the data driver 260 may be integrated in the semiconductor layer SP described with reference to FIG. 2.

The display 100 may include the pixels PXL connected to data lines DL and scan lines SL.

The controller 220 may generate a data driving control signal DCS and a scan driving control signal SCS in response to synchronization signals supplied from the outside. The data driving control signal DCS may be supplied to the data driver 260, and the scan driving control signal SCS may be supplied to the scan driver 240.

In addition, the controller 220 may supply converted image data DATA or black image data BDATA to the data driver 300 based on the input image data IDATA supplied from the outside.

The data driving control signal DCS may include a source start signal and clock signals. The source start signal may control a sampling start time point of data. The clock signals may be used to control a sampling operation.

The scan driving control signal SCS may include scan start signal and clock signals. The scan start signal may control a timing of a scan signal. The clock signals may be used to shift the scan start signal.

In the embodiment, the controller 220 may generate the black image data BDATA corresponding to an imaging frame based on the imaging instruction ICMD. The imaging instruction ICMD may include information indicating an imaging frame. For example, the controller 220 may correct all the input image data IDATA of the imaging frame to the black image data BDATA in response to the imaging instruction ICMD. For example, all grayscale values of the input image data IDATA may be corrected to a value of 0.

The scan driver 240 may receive the scan driving control signal SCS from the controller 220. The scan driver 240 may supply a scan signal to the scan lines SL based on the scan driving control signal SCS.

The scan driver 240 may include a plurality of stage circuits. In the embodiment, the stage circuits may include a CMOS circuit including at least one P-type transistor and at least one N-type transistor. Such a CMOS circuit may be formed during the manufacturing process of the semiconductor layer SP.

The data driver 260 may receive the data driving control signal DCS from the controller 220. The data driver 260 may convert the image data DATA or the black image data BDATA into analog data signals based on the data driving control signal DCS, and may supply the data signals to the display 100 through the data lines DL.

Figure 10:
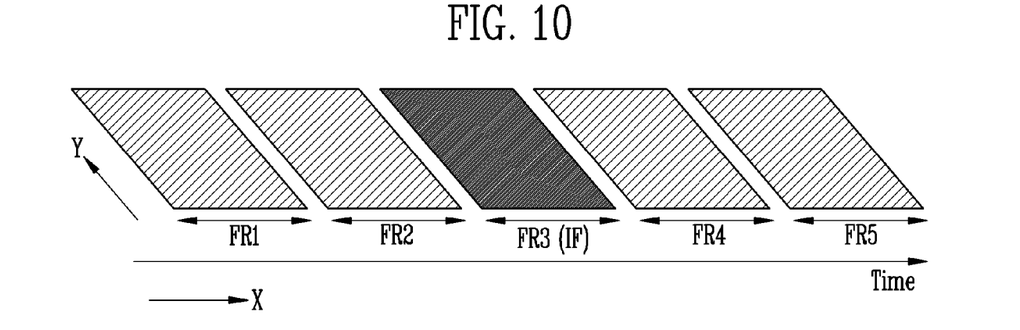
FIG. 10 illustrates an example of an operation of the display device of FIG. 9.

FIG. 10 illustrates an example of an operation of the display device of FIG. 9.

Referring to FIG. 8, FIG. 9, and FIG. 10, the controller 220 may generate the black image data BDATA corresponding to an imaging frame IF based on the imaging instruction ICMD.

As described above, because the display panel and the camera module are provided as one package on the display-on silicon, the quality of the imaged image may deteriorate. The imaging instruction ICMD may include information of the imaging frame IF, and the controller 220 may correct the image data DATA of the imaging frame IF synchronized with an imaging time point of the image sensor 300 to the black image data BDATA. The configuration configured to output the black image data BDATA may be implemented in hardware including logic elements, or may be implemented in software in the controller 220.

As illustrated in FIG. 10, a third frame FR3 may correspond to the imaging frame IF, illustrated as FR3 (IF). In a first frame FR1, a second frame FR2, a fourth frame FR4, and a fifth frame FR5, images may be displayed with luminance corresponding to the input image data IDATA. FIG. 10 uses an X-axis to indicate a time dimension and a Y-axis to indicate a magnitude of luminance of the first through fifth frames F1, F2, F3, F4, through F5. In the third frame FR3, a black image may be displayed, so that the display luminance may deteriorate. In this case, because the image sensor 300 images an image, a flare phenomenon and a ghost phenomenon of the imaged image due to the luminance of the display image of the third frame FR3 may be removed or minimized. The luminance of all of the frames F1-F5 are demonstrated by substantially a same height in the Y-direction.

Accordingly, the quality of the imaged image of the display device in which the display panel DP and the camera module CM are provided as one package may be improved.

Figure 11:
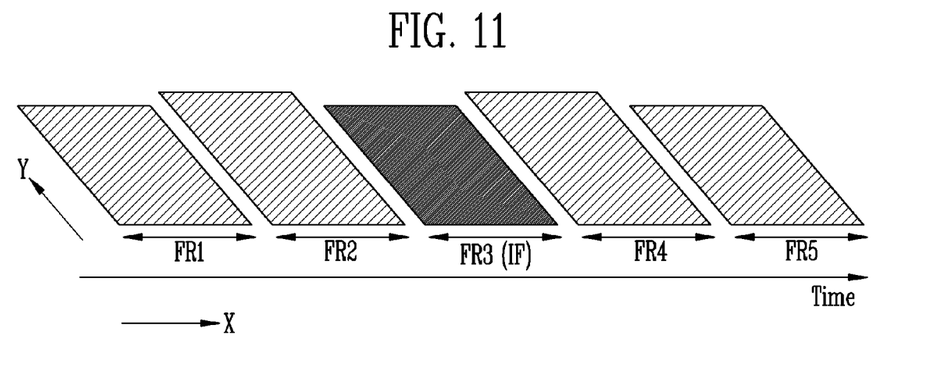
FIG. 11 illustrates an example of an operation of the display device of FIG. 9.

FIG. 11 illustrates an example of an operation of the display device of FIG. 9.

Referring to FIG. 9 and FIG. 11, the controller 220 may generate the black image data BDATA corresponding to the imaging frame IF based on the imaging instruction ICMD.

FIG. 11 illustrates differences in luminance between images of the first frame FR1, the second frame FR2, the fourth frame FR4, and the fifth frame FR5 as heights of the images corresponding to respective frames.

In the embodiment of FIG. 10, black of the third frame FR3 may be instantaneously recognized due to a sudden change in luminance in the third frame FR3.

In the embodiment, in order to improve such poor visibility, the controller 220 may correct the image data DATA of adjacent frames before and after the imaging frame FR3(IF). The controller 220 may correct the image data IDATA of the second frame FR2 and the fourth frame FR4 in the direction (Y-direction) of increasing the luminance of the second frame FR2 and the fourth frame FR4. For example, when the input image data IDATA of the first frame FR1 and the input image data IDATA of the second frame FR2 are the same, by the correction of the input image data IDATA of the second frame FR2 in the controller 220, the luminance of the second frame FR2 may be higher than that of the first frame FR1. The higher luminance of the second frame FR2 is demonstrated by a height in the Y-direction of the second frame FR2 being longer than a height in the Y-direction of the adjacent first frame FR1 and the adjacent third frame FR3. Accordingly, a magnitude of the data signal generated in the first frame FR1 and a magnitude of the data signal generated in the second frame FR2 may be different for the same input grayscale.

Similarly, when the input image data IDATA of the fourth frame FR4 and the input image data IDATA of the fifth frame FR5 are the same, the luminance of the image of the fourth frame FR4 may be made higher than the luminance of the image of the fifth frame FR5. The higher luminance of the fourth frame FR4 is demonstrated by a height in the Y-direction of the fourth frame FR4 being longer than the height in the Y-direction of the third frame FR3 and the fifth frame FR5.

Accordingly, a sharp change in luminance due to the black image display in the imaging frame IF may be compensated to improve image visibility.

Figure 12:
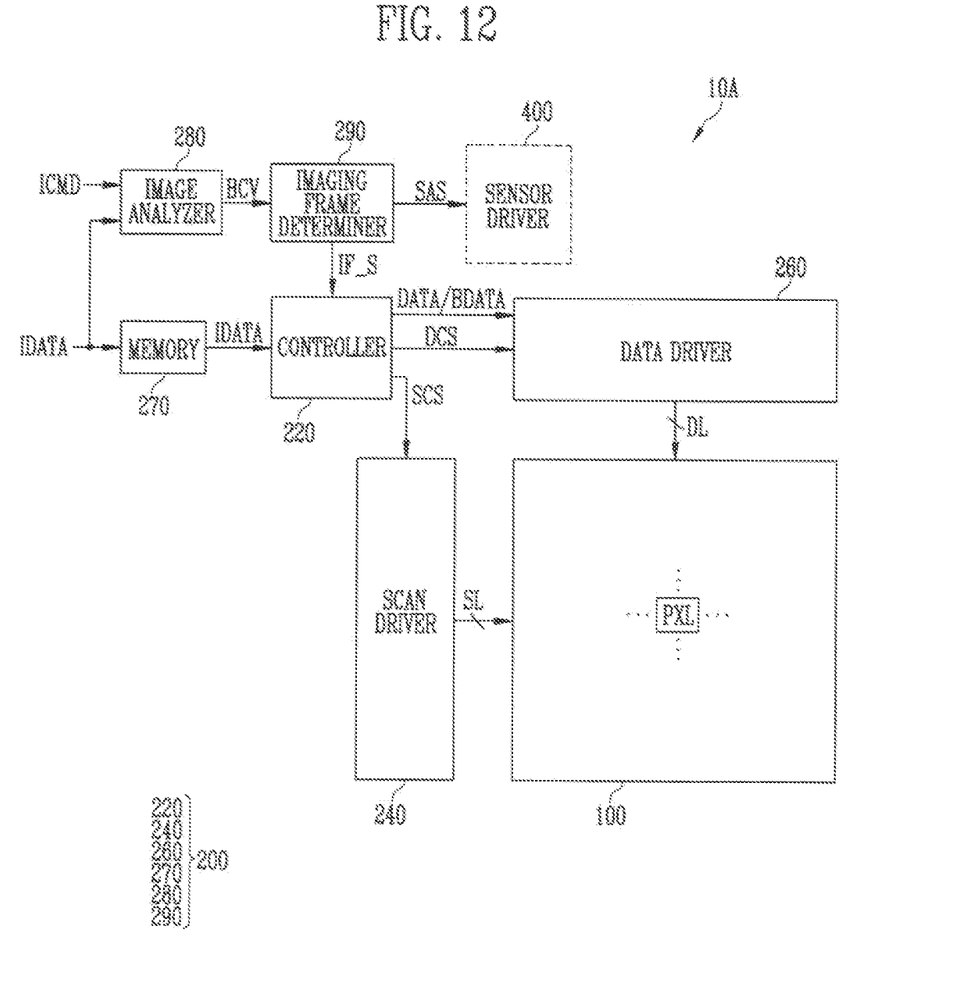
FIG. 12 illustrates a block diagram of an example of a display device included in the electronic device of FIG. 8.

FIG. 12 illustrates a block diagram of an example of a display device included in the electronic device of FIG. 8.

Referring to FIG. 8, FIG. 10, and FIG. 12, a display 10A may include a display driver 200 and a display panel 100. The display driver 200 may include a controller 220, a memory 270, an image analyzer 280, and an imaging frame determiner 290.

At least some functions of the memory 270, the image analyzer 280, and the imaging frame determiner 290 may be included in the controller 220.

In the embodiment, the display driver 200 may analyze the input image data IDATA based on the imaging instruction ICMD, and may determine the imaging frame IF according to the analyzed result. That is, the image sensor 300 may image an image by the imaging frame IF determined by the display driver 200.

The memory 270 may temporarily store the input image data IDATA. For example, the memory 270 may store the input image data IDATA in units of frames. Because correction of the input image data IDATA is performed according to the image analyzed result of the image analyzer 280, the input image data IDATA may be outputted to the controller 220 after being delayed in the memory 270 for at least one frame or more.

The memory 270 may be implemented as a non-volatile memory device or a frame buffer circuit.

The image analyzer 280 may receive the imaging instruction ICMD and the input image data IDATA. The image analyzer 280 may count the black image data of the input image data IDATA in units of frames based on the imaging instruction ICMD.

For example, the image analyzer 280 may count only the black image data (or black grayscale) among the input image data IDATA of one frame serially supplied. A calculated counting value BCV may be provided to the imaging frame determiner 290. The image analyzer 280 may include a configuration such as a counter circuit.

The imaging frame determiner 290 may determine the imaging frame IF based on the counting value BCV. The imaging frame determiner 290 may generate an imaging frame signal IF_S including information on a frame to be the imaging frame IF, and may generate an image sensor activation signal SAS. The imaging frame signal IF_S may be provided to the controller 220, and the image sensor activation signal SAS may be provided to the sensor driver 400.

In the embodiment, the imaging frame determiner 290 may compare the counting value BCV with a predetermined threshold value. The imaging frame determiner 290 may include a comparator that compares the counting value BCV with the threshold value.

The imaging frame determiner 290 may determine a frame in which the counting value BCV is larger than the threshold value as the imaging frame IF, and may provide the imaging frame signal IF_S to the controller 220. That is, the controller 200 may determine a frame having a large proportion of the black image as the imaging frame IF, and may allow an external image to be imaged in the corresponding frame.

When the counting value BCV is smaller than the threshold value, the imaging frame signal IF_S is not generated, and an image based on the input image data IDATA may be displayed in the corresponding frame.

In the embodiment, the controller 220 may provide the image data DATA converted from the input image data IDATA corresponding to the imaging frame IF to the data driver 260 in response to the imaging frame signal IF_S. As such, the controller 200 according to the embodiment of FIG. 12 does not generate the black image data BDATA in response to the imaging instruction ICMD, but may determine the input image data IDATA, a frame (for example. a low luminance frame) having a large proportion of the black image as the imaging frame IF. Accordingly, a configuration and driving configured to drive correct the input image data IDATA into the black image data BDATA may be omitted.

In the embodiment, the controller 220 may generate the black image data BDATA by correcting input image data IDATA corresponding to the imaging frame IF in response to the imaging frame signal IF_S, and may provide the black image data BDATA to the data driver 260. Accordingly, the correcting of the input image data IDATA to the black image data BDATA may be minimized.

The sensor driver 400 may activate the image sensor 300 in response to the image sensor activation signal SAS. Accordingly, the image sensor 300 may image an external image in the imaging frame IF.

In the embodiment, the image sensor activation signal SAS may be provided to the sensor driver 400 through the processor 500.

In another embodiment, the image sensor activation signal SAS may be directly provided to the sensor driver 400 without passing through the processor 500. In this case, an interface may be formed (and connected) between the display driver 200 and the sensor driver 400.

As described above, the display device and the electronic device including the same according to the embodiments of the present invention may have a configuration in which an image sensor is integrated into display-on silicon and is packaged. Accordingly, a connector or cable such as an FPCB connected to a camera module including the image sensor may be removed, and it is possible to easily implement an ultra-small display device applied to smart glasses that realizes an augmented reality image.

In addition, by lowering display luminance when imaging an image in the configuration in which the image sensor is integrated into the display-on silicon, flare and ghosting of the imaged image due to luminance of a display image are eliminated or minimized, and quality of the imaged image may be improved.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

Although certain embodiments and implementations have been described herein, other embodiments and modifications will be apparent from this description. Accordingly, the inventive concepts are not limited to such embodiments, but rather to the broader scope of the appended claims and various modifications and equivalent arrangements as would be apparent to a person of ordinary skill in the art.

What is claimed is:

1. A display device comprising:
   a silicon substrate;
   a semiconductor layer provided on the silicon substrate and including a pixel circuit;
   an image sensor provided on the silicon substrate and activated based on an imaging instruction;
   light emitting elements disposed on the semiconductor layer and electrically connected to the pixel circuit; and
   a display driver electrically connected to the pixel circuit to control the pixel circuit and to control image luminance of an imaging frame in which the image sensor is activated,
   wherein the display driver corrects image data of first and second frames adjacent to before and after the imaging frame to increase luminance of the first frame and luminance of the second frame.

2. The display device of claim 1, wherein the display driver generates black image data corresponding to the imaging frame based on the imaging instruction, and provides a data signal corresponding to the black image data to the pixel circuit.

3. The display device of claim 2, wherein the light emitting elements display a black image in the imaging frame.

4. The display device of claim 2, wherein the silicon substrate includes a single crystal silicon wafer, a polycrystalline silicon wafer, or an amorphous silicon wafer.

5. The display device of claim 4, wherein the pixel circuit includes a CMOS circuit.

6. The display device of claim 5, wherein each of the light emitting elements includes an inorganic light emitting element, and
   the semiconductor layer further includes:
   a contact protruding from the pixel circuit in a vertical direction to electrically connect the inorganic light emitting element and the pixel circuit.

7. The display device of claim 5, wherein each of the light emitting elements includes an organic light emitting element.

8. The display device of claim 2, wherein the image sensor includes a CMOS image sensor, and
   the image sensor is mounted on the semiconductor layer in a form of a module.

9. The display device of claim 2, wherein the image sensor includes a CMOS image sensor, and
   the image sensor is integrated into the semiconductor layer.

10. The display device of claim 1, wherein when input image data of the first frame and input image data of a third frame not adjacent to the imaging frame are the same, the luminance of the first frame is higher than that of the third frame.

11. The display device of claim 1, wherein the display driver comprises:

a controller generating black image data corresponding to the imaging frame based on the imaging instruction; and a data driver converting the black image data into an analog data signal and supplying the data signal to the light emitting elements.

12. A display device comprising:

a silicon substrate;

a semiconductor layer provided on the silicon substrate and including a pixel circuit;

an image sensor provided on the silicon substrate and activated based on an imaging instruction;

light emitting elements disposed on the semiconductor layer and electrically connected to the pixel circuit; and a display driver electrically connected to the pixel circuit to control the pixel circuit and to control image luminance of an imaging frame in which the image sensor is activated, wherein the display driver comprises:

a controller generating black image data corresponding to the imaging frame based on the imaging instruction;

a data driver converting the black image data into an analog data signal and supplying the data signal to the light emitting elements;

a memory temporarily storing input image data;

an image analyzer counting black image data of the input image data in units of frames based on the imaging instruction; and an imaging frame determiner determining the imaging frame based on a counting value of the black image data and generating an image sensor activation signal.

13. The display device of claim 12, wherein the imaging frame determiner compares the counting value with a predetermined threshold value and determines a frame in which the counting value is larger than the threshold value as the imaging frame.

14. The display device of claim 12, wherein the image sensor images an external image in the imaging frame in response to the image sensor activation signal.

15. An electronic device comprising:

a silicon substrate;

a semiconductor layer provided on the silicon substrate and including a pixel circuit;

an image sensor provided on the semiconductor layer and imaging an image;

light emitting elements disposed on the semiconductor layer and electrically connected to the pixel circuit;

a display driver electrically connected to the pixel circuit to control the pixel circuit and to control image luminance of an imaging frame in which the image sensor is activated;

a sensor driver controlling the image sensor based on an imaging instruction; and a processor providing the imaging instruction to the display driver and the sensor driver, wherein the display driver corrects image data of first and second frames adjacent to before and after the imaging frame to increase luminance of the first frame and luminance of the second frame.

16. The electronic device of claim 15, wherein the display driver generates black image data corresponding to the imaging frame based on the imaging instruction and provides a data signal corresponding to the black image data to the pixel circuit; and the light emitting elements display a black image in the imaging frame.

17. The electronic device of claim 16, wherein at least one of the image sensor and the processor is mounted on the semiconductor layer.

18. The electronic device of claim 15, wherein the processor generates input image data corresponding to an augmented reality image in which an image obtained from the image sensor and a display image are combined, and provides the input image data to the display driver.

* * * * *